(12) United States Patent
McGlory et al.

(10) Patent No.: US 7,733,104 B2
(45) Date of Patent: Jun. 8, 2010

(54) LOW FORCE INTERCONNECTS FOR PROBE CARDS

(75) Inventors: John McGlory, Chandler, AZ (US); Anh-Tai Thai Nguyen, Gilbert, AZ (US); John William Clancy, III, Gilbert, AZ (US); Senthil Theppakuttai, Scottsdale, AZ (US); Bahadir Tunaboylu, Chandler, AZ (US)

(73) Assignee: SV Probe Pte. Ltd., Singapore (SG)

( * ) Notice: Subject to any disclaimer, the term of this patent is extended or adjusted under 35 U.S.C. 154(b) by 0 days.

(21) Appl. No.: 12/106,827

(22) Filed: Apr. 21, 2008

(65) Prior Publication Data

US 2009/0261849 A1    Oct. 22, 2009

(51) Int. Cl.
*G01R 31/02* (2006.01)
(52) U.S. Cl. .................. 324/754; 324/758; 324/762
(58) Field of Classification Search .................. None
See application file for complete search history.

(56) References Cited

U.S. PATENT DOCUMENTS 7,108,546 B2 *  9/2006  Miller et al. ................ 439/578
7,252,514 B2 *  8/2007  McKnight et al. ............. 439/66

* cited by examiner

*Primary Examiner*—Minh N Tang
(74) *Attorney, Agent, or Firm*—Hickman Palermo Truong & Becker LLP; Edward A. Becker

(57) ABSTRACT

A probe test card assembly for testing of a device under test includes a printed circuit board, a substrate and a substrate support structure. The substrate support structure holds the substrate in position with respect to the printed circuit board. The substrate support structure may include one or more alignment members, one or more hard stop members and/or a support plate attached to the printed circuit board for positioning the substrate with respect to the printed circuit board. The one or more alignment members may extend through the printed circuit board and be connected to the one or more printed circuit board stiffener members. The probe test card assembly may also employ a proximity detection feature to indicate when the substrate is in a particular position with respect to the printed circuit board.

11 Claims, 5 Drawing Sheets

LOW FORCE INTERCONNECTS FOR PROBE CARDS

FIELD OF THE INVENTION

This invention relates generally to integrated circuit testing using probe cards.

BACKGROUND

The approaches described in this section are approaches that could be pursued, but not necessarily approaches that have been previously conceived or pursued. Therefore, unless otherwise indicated, the approaches described in this section may not be prior art to the claims in this application and are not admitted to be prior art by inclusion in this section.

In semiconductor integrated circuit manufacturing, it is conventional to test integrated circuits ("IC's") during manufacturing and prior to shipment to ensure proper operation. Wafer testing is a well-known testing technique commonly used in production testing of wafer-mounted semiconductor IC's, wherein a temporary electrical connection is established between automatic test equipment (ATE) and each IC formed on the wafer to demonstrate proper performance of the IC's. Components that may be used in wafer testing include an ATE test board, which is a multilayer printed circuit board that is connected to the ATE, and that transfers the test signals between the ATE and a probe card assembly. The probe test card assembly (or probe card) includes a printed circuit board that generally contains several hundred probe needles (or "probes") positioned to establish electrical contact with a series of connection terminals (or "die contacts") on the IC wafer. Conventional probe card assemblies include a printed circuit board, a substrate or probe head having a plurality of flexible test probes attached thereto, and an interposer that electrically connects the probes to the printed circuit board. The interposer conventionally includes telescopic "pogo pins" or solder bumps that provide electrical connections between conductive pads on the printed circuit board and the interposer and between the interposer and conductive pads on the substrate. The test probes are conventionally mounted to electrically conductive, typically metallic, bonding pads on the substrate using solder attach, wire bonding or wedge bonding techniques The pogo pin or solder bump connections used with conventional probe card assemblies have some significant limitations. For example, pogo pins use spring components that exert a high aggregate amount of force against the substrate when used in large numbers. The spring components used in pogo pins can also stick or wear out over time, resulting in a "floating contact." Pogo pins are also generally very labor intensive to install, especially in high density applications, and do not have high planarity. They have high deflection capability but their coplanarity is poor. The high force exerted by pogo pins can deflect, misalign or even crack a substrate. Thus, pogo pins are not a scalable solution for higher density applications. Solder bumps do not have the same spring component-related problems as pogo pins, but solder bumps sometimes do not provide reliable electrical contact, resulting in floating contacts, i.e., an open circuit. Also, solder bumps are not readily repairable, since they are normally created using solder flow techniques that cannot be used to repair an individual solder bump. Solder reflow technology works well only for smaller reflow areas—scalability to 10 and 12 inches would be a problem.

Based on the foregoing, there is a need for a probe card assembly that does not suffer from limitations of conventional probe card assemblies.

BRIEF DESCRIPTION OF THE DRAWINGS

In the figures of the accompanying drawings like reference numerals refer to similar elements.

DETAILED DESCRIPTION

Figure 1:
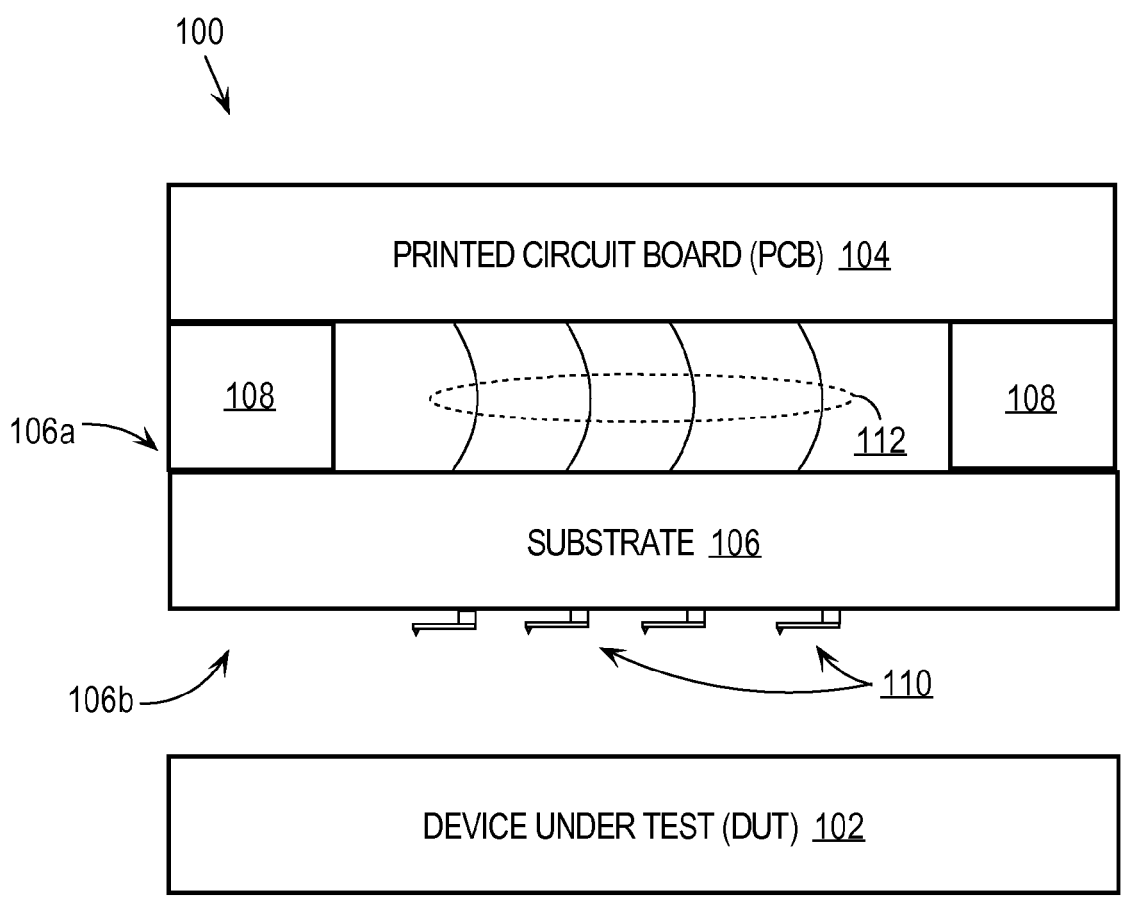
FIG. 1 depicts a probe card assembly for testing a device under test (DUT), according to one embodiment of the invention.

In the following description, for the purposes of explanation, numerous specific details are set forth in order to provide a thorough understanding of the present invention. It will be apparent, however, to one skilled in the art that the present invention may be practiced without these specific details. In other instances, well-known structures and devices are shown in block diagram form in order to avoid unnecessarily obscuring the present invention. Various aspects of the invention are described hereinafter in the following sections:

I. OVERVIEW
II. PROBE CARD ASSEMBLY WITH SUBSTRATE SUPPORT STRUCTURE
III. SUBSTRATE CONFIGURATIONS
IV. SUBSTRATE SUPPORT STRUCTURES
  A. Substrate Through-Hole Assembly
  B. Bonded Attachment Assembly
V. SUBSTRATE-TO-PCB INTERCONNECTS I. Overview A probe test card assembly for testing of a device under test includes a printed circuit board, a substrate and a substrate support structure. A plurality of test probes is connected to the substrate for making electrical contact with the device under test. A plurality of interconnects is bonded to electrical contacts on the substrate and electrical contacts on the printed circuit board to provide electrical connections between the substrate and the printed circuit board. The substrate support structure holds the substrate in position with respect to the printed circuit board. The substrate support structure may include one or more alignment members attached to the printed circuit board and the substrate for aligning the substrate with respect to the printed circuit board. The probe test card assembly may also include one or more printed circuit board stiffener members attached to the printed circuit board for providing structural support for the printed circuit board. The one or more alignment members may extend through the printed circuit board and be connected to the one or more printed circuit board stiffener members. The substrate support structure may further include one or more hard stop members attached to one or more stiffener members on the printed circuit board and against the substrate for maintaining at least a minimum separation between the printed circuit board and the substrate. The probe test card assembly may also employ a proximity detection mechanism to indicate when the substrate is in a particular position with respect to the printed circuit board. Embodiments of the invention also include attaching the substrate to a support plate that is attached to the printed circuit board.

The probe test card assembly with a substrate support structure as described herein has several benefits over conventional probe test cards. In particular, the assembly places very low force, or no force, on the substrate. This eliminates the problems caused by stress forces on the substrate during probing, such as deflection and cracking of the substrate, and allows the use of very thin substrates for larger and high probe count applications.

II. Probe Card Assembly with Substrate Support Structure

FIG. 1 depicts a probe card assembly 100 for testing a device under test (DUT) 102. The probe card assembly includes a printed circuit board (PCB) 104 and a substrate 106 held in position via a substrate support structure 108. PCB 104 is configured with circuitry for testing DUT 102. The substrate 106 includes a first side 106a that substantially faces the PCB 104 and a second side 106b that substantially faces the DUT 102. A set of test probes 110 is attached to the second side 106b of the substrate 106 and during testing is aligned with respective pads or contacts on DUT 102. Substrate 106 may be one or more layers and one example of substrate 106 is a ceramic layer. Instead of a single element, substrate 106 may also be comprised of a set of substrate tiles that together form substrate 106. Although the test probes 110 are depicted in FIG. 1 as cantilever style test probes, this style of test probe is provided for explanation purposes only and any type of test probe may be used, for example, vertical test probes. A set of electrical connections 112 are formed between PCB 104 and substrate 106. The electrical connections 112 may comprise very fine wires attached to electrical contacts on PCB 104 and electrical contacts on substrate 106.

III. Substrate Configurations

Figure 2:
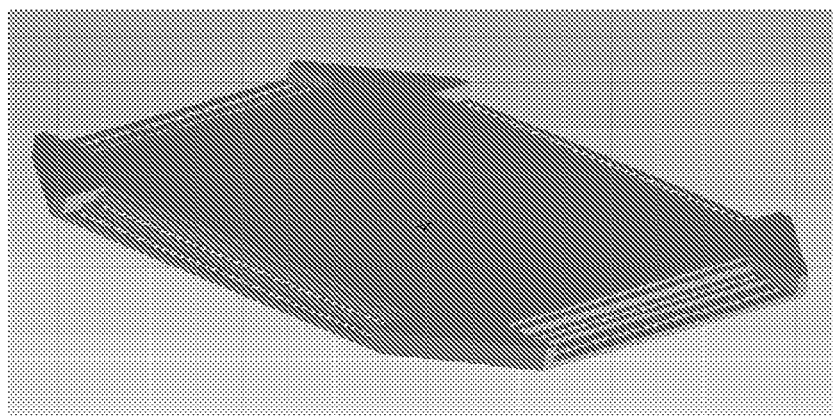
FIG. 2 depicts a substrate according to one embodiment of the invention.

Substrate 106 may have a wide variety of characteristics, depending upon a particular implementation. For example, substrate 106 may be rectangular-shaped or disc-shaped and may be made from a wide variety of materials. FIG. 2 depicts a substrate 200 according to one embodiment of the invention. In this example, the top side of the substrate 200 is depicted. Test probes are bonded to the top side of the substrate 200 and the bond traces where the test probes are attached on the substrate are routed to the periphery of the substrate 200. As depicted in FIG. 2, the substrate 200 includes multiple steps on the periphery and the wedge bond pads are located on the steps. The step configuration is useful in high test probe count applications. The test probes may be attached to the substrate 200 either before assembling the substrate to the PCB, or as a final step after the substrate final assembly and wedge bonding.

IV. Substrate Support Structures

A wide variety of substrate support structures may be used, depending upon a particular implementation. Embodiments of the invention include using a substrate through-hole assembly and a bonded attachment assembly, as described in more detail hereinafter.

A. Substrate Through-Hole Assembly

Figure 3:
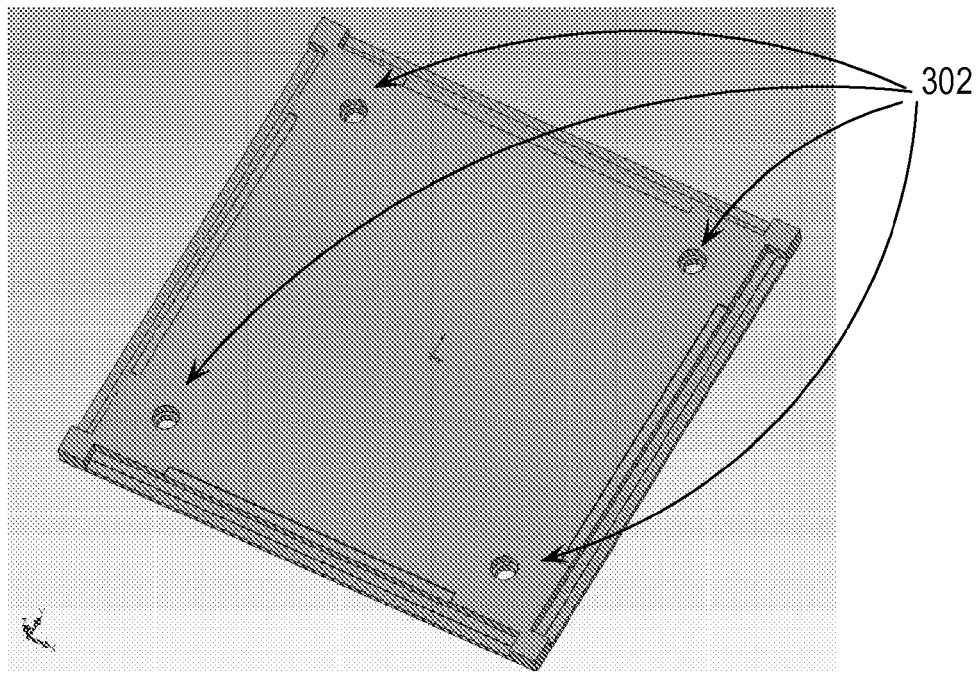
FIG. 3 depicts a substrate having four through-holes.

According to one embodiment of the invention, a substrate through-hole assembly is used to support the substrate in position with respect to the PCB. According to this approach, the substrate 106 is clamped to the PCB 104 using screws extending through holes formed in the substrate. The location, number, size and shape of the through-holes in the substrate may vary depending on the design and pin count. FIG. 3 depicts a substrate 300 having four through-holes 302.

Figure 4:
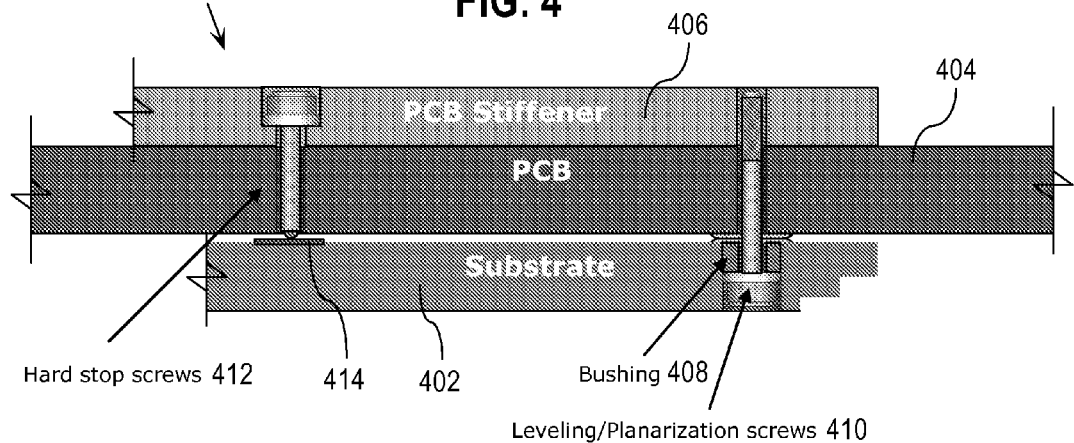
FIG. 4 depicts a probe test card assembly using a substrate through-hole assembly to position a substrate with respect to a PCB, according to one embodiment of the invention.

FIG. 4 depicts a probe test card assembly 400 using a substrate through-hole assembly to position a substrate with respect to a PCB, according to one embodiment of the invention. Assembly 400 includes a substrate 402, a PCB 404 and a PCB stiffener 406. Bushings 408 are installed in holes in substrate 402. The bushings 408 may be made from a wide variety of materials, for example, ceramics, aluminum, brass, etc. The bushings 408 may be bonded into the holes in substrate 402. The substrate 402 is aligned to the PCB 404 and held in place using one or more leveling/planarization screws 410 installed through the bushings 408. The leveling/planarization screws 410 are installed through the substrate 402, PCB 404 and into the PCB stiffener 406, and are used for holding the substrate 402 in place while probing. In addition to holding the substrate 402 in position with respect to the PCB 404, the leveling/planarization screws 410 can be used to level or planarize the substrate 402 with respect to the PCB 404. The PCB stiffener 406 is not required, but may be helpful in some applications to provide additional support for the PCB 404 and/or to receive the leveling/planarization screws 410.

According to one embodiment of the invention, assembly 400 also includes one or more hard stop screws 412. The hard stop screws 412 prevent the substrate 402 from deflecting while probing. The location and number of hard stop screws 412 may vary depending on the design and test probe count. According to one embodiment of the invention, the hard stop screws 412 are installed through the PCB stiffener 406, through the PCB 404 and make contact with a pad 414 on the substrate 402. The pad 414 may be made from a variety of materials, for example a metal.

Figure 5:
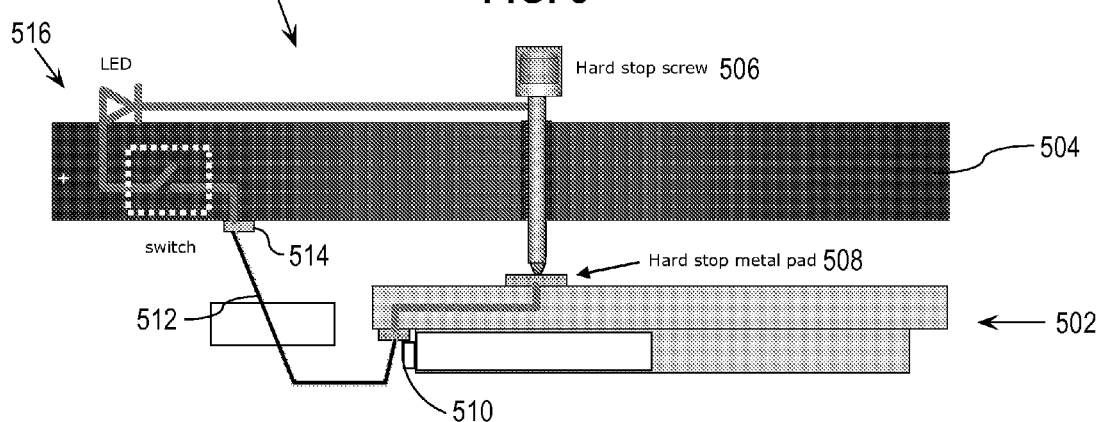
FIG. 5 depicts a portion of an example probe test card assembly that includes a proximity detection mechanism, according to one embodiment of the invention.

According to one embodiment of the invention, assembly 400 includes a proximity detection mechanism configured to indicate when the substrate 402 is at a specified location with respect to the PCB 404. FIG. 5 depicts a portion of an example probe test card assembly 500 that includes an example proximity detection mechanism. Assembly 500 includes a substrate 502, a PCB 504 and a hard stop screw 506 for positioning substrate 502 with respect to PCB 504. The hard stop screw 506 makes contact with a hard stop metal pad 508, disposed on substrate 502. In the present example, the hard stop metal pad 508 is electrically connected to a wire bond pad 510. A wire bond 512 is connected between the wire bond pad 510 and a pad 514 on the PCB 504. A circuit and/or electrical connections 516 are provided for lighting an LED when the hard stop screw 506 makes electrical contact with the hard stop metal pad 508 on the substrate 502. This allows precise control over the amount of force that is applied to substrate 502, which reduces the deflection, cracking or other stresses on the substrate 502. Thus, substrate 502 can made of delicate materials and/or be larger than would otherwise be possible. Although the proximity detection mechanism is depicted in FIG. 5 and described herein in the context of an electrical proximity detection mechanism, the invention is not limited to this context and other types of proximity detection mechanisms may be used. For example, a mechanical or pressure-based proximity detection mechanism may be used to detect when the hard stop screw 506 makes contact with the hard stop metal pad 508. In this example, the hard stop metal pad 508 may be made of other materials.

B. Bonded Attachment Assembly

Figure 6:
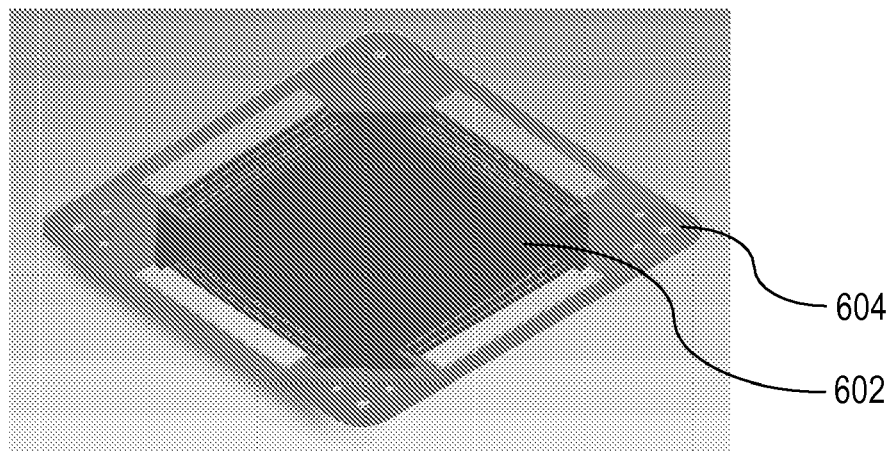
FIG. 6 depicts a bonded attachment assembly according to one embodiment of the invention.

According to another embodiment of the invention, a bonded attachment assembly is used to support the substrate in position with respect to the PCB. FIG. 6 depicts a bonded attachment assembly 600 according to one embodiment of the invention. Assembly 600 includes a substrate 602 supported by a support plate 604. The support plate may be made of a variety of materials, for example Molybdenum. The substrate 602 may be attached to the support plate 604, for example by bonding using an adhesive or epoxy. The support plate 604 is attached to the PCB (not depicted in FIG. 6) and may be attached to both the PCB and a PCB stiffener (not depicted in FIG. 6). The substrate 602 may be planarized with respect to the PCB, for example using the attachment mechanism used to attach the substrate 602 to the PCB.

Figure 7:
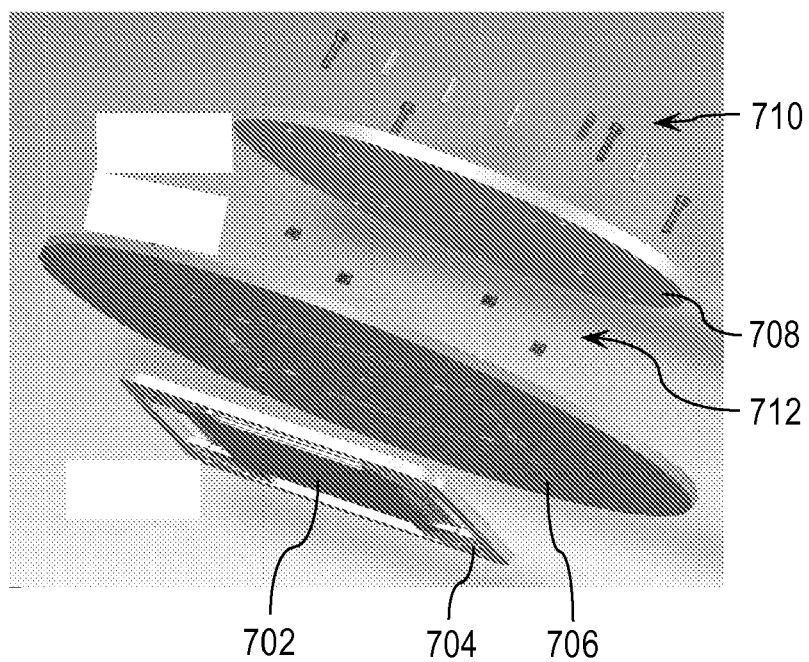
FIG. 7 depicts an example probe test card assembly according to one embodiment of the invention.

FIG. 7 depicts an example probe test card assembly 700 according to one embodiment of the invention. Assembly 700 includes a substrate 702 mounted to a support plate 704. The support plate 704 is mounted to a PCB 706 and a PCB stiffener 708 using screws and hard stops 710 and bushings 712. The screws and hard stops 710 and bushings 712 allow the substrate 702 to be precisely positioned with respect to the PCB 706 and prevent the substrate 702 from moving or deflecting while probing. A proximity detection mechanism, as previously described herein, may be used with assembly 700 to position the substrate 702 relative to PCB 706.

V. Substrate-to-PCB Interconnects

Figure 8:
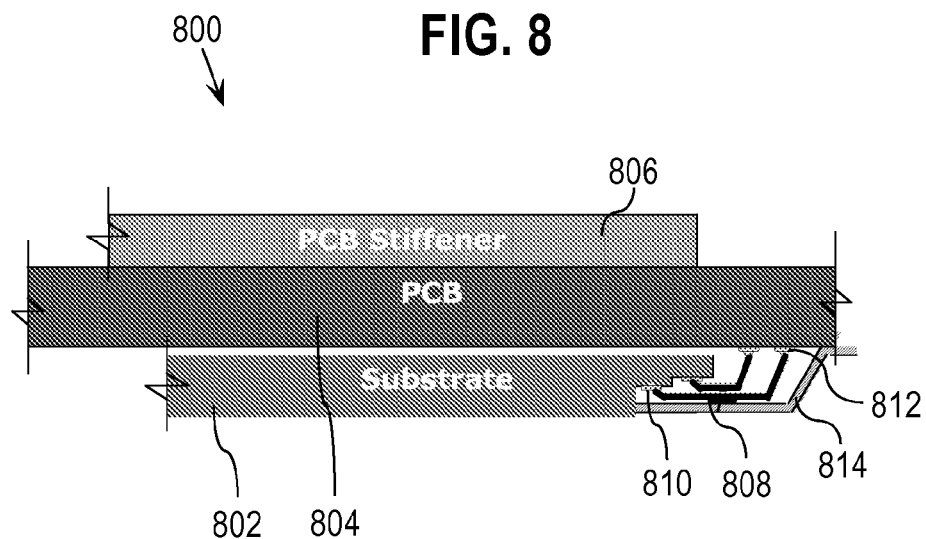
FIG. 8 depicts probe test card assembly that includes a protective cover for protecting wedge bond wires from handling and other damage.

As previously described herein, interconnects are bonded to electrical contacts on the substrate and electrical contacts on the printed circuit board to provide electrical connections between the substrate and the printed circuit board. According to one embodiment of the invention, the interconnects between the substrate and PCB are achieved by wedge bonding very fine gold, aluminum, or copper wires. The interconnects used in a particular probe test card assembly may be the same size or different sizes, depending upon a particular application. Example diameters are in the range of about 25 um to about 50 um. Insulated wires or protective encapsulation may be used after wedge bonding to prevent leakage and shorting between the wedge-bonded wires. FIG. 8 depicts a probe test card assembly 800 that includes a protective cover for protecting wedge bond wires from handling and other damage. Assembly 800 includes a substrate 802, a PCB 804 and a PCB stiffener 806. A set of interconnects are wedge bonded to pads 810 on the substrate and pads 812 on the PCB 804. A protective cover 814 is formed over interconnects 808. Protective cover 814 may be made from a variety of materials, such as plastic, metal or a dielectric material, and may be the same or a different material than the substrate 802.

Figure 9:
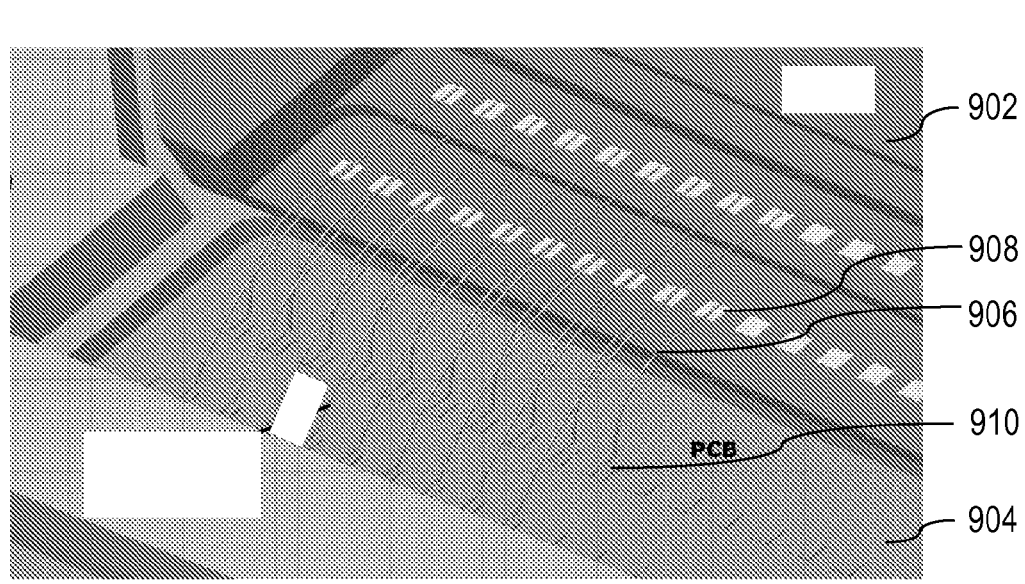
FIG. 9 depicts a portion of a probe test card assembly that includes a substrate and a PCB.

FIG. 9 depicts a portion of a probe test card assembly 900 that includes a substrate 902 and a PCB 904. Interconnects 906 are wire bonded to pads 908 on the substrate and pads 910 on the PCB 904.

In the foregoing specification, embodiments of the invention have been described with reference to numerous specific details that may vary from implementation to implementation. Thus, the sole and exclusive indicator of what is, and is intended by the applicants to be the invention is the set of claims that issue from this application, in the specific form in which such claims issue, including any subsequent correction. Hence, no limitation, element, property, feature, advantage or attribute that is not expressly recited in a claim should limit the scope of such claim in any way. The specification and drawings are, accordingly, to be regarded in an illustrative rather than a restrictive sense.

What is claimed is:

1. A probe test card assembly comprising:
a printed circuit board;
a substrate having a plurality of test probes attached to the substrate for making electrical contact with a device under test;
a substrate support structure for holding the substrate adjacent to, but not in contact with, the printed circuit board;
a plurality of interconnects bonded to electrical contacts on the substrate and electrical contacts on the printed circuit board to provide electrical connections between the electrical contacts on the substrate and the electrical contacts on the printed circuit board; and
a protective cover attached to the substrate and covering the plurality of interconnects without contacting the plurality of interconnects and wherein the protective cover defines a void between the protective cover, the printed circuit board and the substrate in which the plurality of interconnects is disposed and can move.

2. The probe test card assembly recited in claim 1, wherein the protective cover comprises a non-conductive material.

3. The probe test card assembly recited in claim 1, wherein one or more of the plurality of interconnects are insulated wires.

4. The probe test card assembly recited in claim 1, wherein the plurality of interconnects are wedge bonded to the electrical contacts on the substrate.

5. The probe test card assembly recited in claim 1, wherein the substrate support structure includes one or more alignment members attached to the printed circuit board and the substrate for aligning the substrate with respect to the printed circuit board.

6. The probe test card assembly recited in claim 5, wherein the one or more alignment members includes one or more leveling/planarization screws attached to the printed circuit board and the substrate.

7. The probe test card assembly recited in claim 5, further comprising one or more printed circuit board stiffener members attached to the printed circuit board for providing structural support for the printed circuit board and wherein the one or more alignment members are also connected to the one or more printed circuit board stiffener members.

8. The probe test card assembly recited in claim 1, wherein the substrate support structure includes one or more hard stop members attached to the printed circuit board and against the substrate for maintaining at least a minimum separation between the printed circuit board and the substrate.

9. The probe test card assembly recited in claim 1, wherein the substrate support structure includes a support plate bonded to the printed circuit board and supporting the substrate.

10. The probe test card assembly recited in claim 1, further comprising a proximity detection mechanism that indicates when the substrate is at a specified location with respect to the printed circuit board.

11. A probe test card assembly comprising:
a printed circuit board;
a substrate having a plurality of test probes attached to the substrate for making electrical contact with a device under test;
a substrate support structure for holding the substrate adjacent to, but not in contact with, the printed circuit board;
a plurality of interconnects bonded to electrical contacts on the substrate and electrical contacts on the printed circuit board to provide electrical connections between the electrical contacts on the substrate and the electrical contacts on the printed circuit board; and
a proximity detection mechanism that indicates when a hard stop attached to the printed circuit board makes contact with the substrate.

* * * * *